United States Patent [19]

Poppa

[11] 4,153,887
[45] May 8, 1979

[54] ELECTRICALLY TUNABLE BANDPASS FILTER
[75] Inventor: Rocco Poppa, Fort Wayne, Ind.
[73] Assignee: The Magnavox Company, Fort Wayne, Ind.
[21] Appl. No.: 857,852
[22] Filed: Dec. 5, 1977
[51] Int. Cl.² .......................... H03H 7/10; H03J 3/26
[52] U.S. Cl. .................................. 333/172; 333/175; 334/56
[58] Field of Search ...................... 333/70 R, 76, 70 S, 333/75; 330/302, 304–306; 328/167, 262, 263; 334/59, 60, 47, 56

[56] References Cited
U.S. PATENT DOCUMENTS 2,581,159  1/1952  Achenbach .......................... 334/56
3,903,487  9/1975  Maier .................................. 334/60

*Primary Examiner*—Alfred E. Smith
*Assistant Examiner*—Marvin Nussbaum
*Attorney, Agent, or Firm*—William J. Streeter; Thomas A. Briody

[57] ABSTRACT

A bandpass filter is described for filtering a television signal. The filter has a passband which may be selectively centered for filtering signals in one of two channels of the television receiver. The television channel at which the filter passband is centered is selectable by applying a voltage to a control terminal. The filter frequency response for each channel selected may be independently controlled and a linear phase response is realized for the selected channel minimizing distortion.

5 Claims, 3 Drawing Figures

ELECTRICALLY TUNABLE BANDPASS FILTER

BACKGROUND OF THE INVENTION

The present invention relates to filtering signals which are received by a television receiver. Specifically a bandpass filter is provided for filtering the signal which is applied to a television receiver antenna terminal.

Recently a number of accessory devices have been available for generating signals containing information for displaying images or symbols on a television receiver. These devices include video games and video recorders which when operatively connected to the antenna terminals of a television receiver cause images to be displayed on the television receiver picture tube.

These devices all generate a radio frequency (RF) carrier signal having a frequency identical to that of a television station broadcast carrier. The carrier is modulated with picture and/or sound information and a composite signal centered at the frequency of a television broadcast channel is generated. The composite signal is applied to the antenna terminals of the television receiver. The television receiver when tuned to a channel corresponding to the channel frequency of the transmitted composite signal processes the composite signal producing an image and/or sound.

The information bearing radio frequency signal provided by these devices must have a frequency spectrum substantially the same as the signal provided by a broadcast television transmitter. In the NTSC system this modulated signal has a bandwidth of substantially 6 mHz.

The bandwidth limitations on a signal produced by an accessory device are imposed by a bandpass filter having a bandwidth of 6 mHz. The filter has a passband coinciding with the frequency spectrum occupied by a television broadcast signal. In order to preserve the information contained in the signal, the filter must be phase linear over the 6 mHz bandwidth.

Some of the devices which generate signals for application to a television receiver antenna terminal do so on more than one carrier frequency. Therefore it is desirable to provide a bandpass filter having a passband which may be centered at one of two television channels. The bandwidth of the filter must remain 6 mHz for each channel which is filtered, and the phase linearity of the filter over the 6 mHz bandwidth must also remain constant.

SUMMARY OF THE INVENTION

It is an object of this invention to provide a filter for processing a television signal.

It is another object of this invention to provide a filter which can process signals for two different television channels.

These and other objects of the invention are accomplished by a bandpass filter which has a passband which may be centered at different frequencies. The passband center frequency is selectable to coincide with a television channel passband. The bandwidth of the filter for each center frequency may be separately controlled and the phase linearity is maintained constant for each frequency of operation.

In one embodiment of the invention a plurality of filter sections are serially connected with input and output terminals. Each filter section has a capacitor terminating the series combination of two inductors forming a resonant circuit. A first set of coupling capacitors couples one end of each series combination of inductors in a series circuit. A second set of capacitors connects the common connection of the inductors in each filter section in a series circuit. The remaining ends of the series combination of inductors is connected to a common terminal. The center frequency of the filter passband is altered by shunting one of the inductors in each filter section. Shunting the inductors may be accomplished by either mechanical or electrical switch means.

DESCRIPTION OF THE PREFERRED EMBODIMENT

Figure 1:
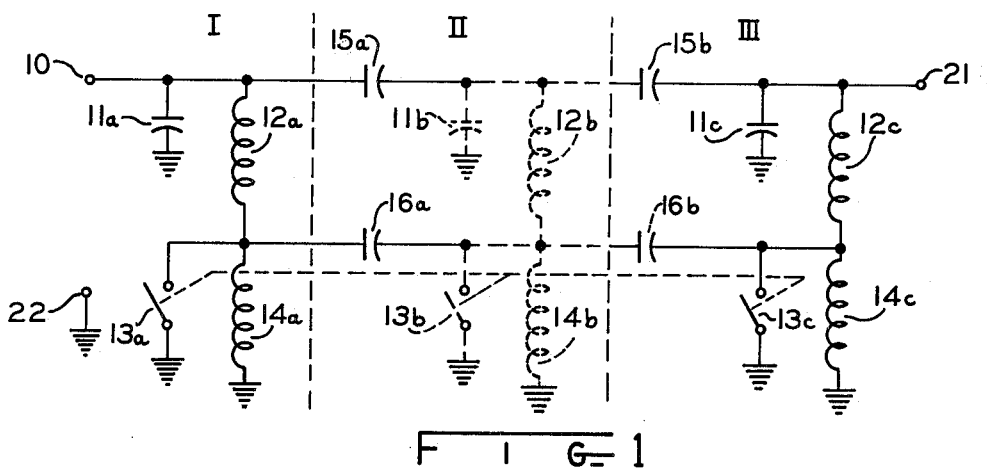
FIG. 1 is a schematic drawing of a first embodiment of the invention whereby a filter having a passband which may be shifted in frequency is realized.

Referring now to FIG. 1, there is shown a schematic drawing of an embodiment of this invention. The filter comprises three separate sections I, II and III. An input signal is applied to a terminal 10 where it is connected to filter section I. Sections I, II and III are coupled together by a first and second plurality of capacitors 15a, 15b, 16a, 16b. An output terminal 21 is coupled to filter section III for delivering the filtered signal. A ground terminal 22 serves as a common terminal. Filter sections I, II and III are parallel resonant circuits. When switches 13a, 13b and 13c are closed, each filter section has a parallel resonance determined primarily by inductors 12 and capacitors 11. The value of inductance for inductors 12 and capacitance for capacitors 11 provide parallel resonance at the center of the frequency passband for television channel 3, i.e. 63 mHz. The coupling capacitors 15a and 15b couple these parallel resonant filter sections together realizing a multisection bandpass filter. The bandwidth of the bandpass filter may be modified by selectively adjusting the value of capacitors 15a and 15b. The phase response of the bandpass filter over the filter bandpass is maintained linear. The linear phase response prevents distortion to the video and chroma information contained within the signal being filtered.

The passband of the filter is shifted down in frequency by opening switches 13a, 13b and 13c. Inductors 14a, 14b and 14c are serially connected with inductors 12a, 12b and 12c. The common junction between inductors 12 and inductors 14 are connected in a series circuit by capacitors 16a and 16b. The result of the circuit change by opening switches 13 is a lowering of the resonant frequency of each filter section I, II and III. The bandwidth of the bandpass filter is maintained at 6 mHz as both the inductance and capacitance of each filter section is raised and the Q of each resonant filter section remains the same upon opening the switch.

The overall bandwidth of the filter when operating at the lower frequency is determined by the value of capacitors 16a and 16b. In one embodiment, the lower frequency of the filter bandpass was selected to provide a passband identical to channel 3 of the television receiver. Capacitors 16a and 16b will not effect the filter response when switches 13 are closed. The linear phase response of the bandpass filter is maintained when switches 13 are in either the closed or open position.

FIG. 1 has been described as a filter having three sections. Those skilled in the art will recognize that many sections may be connected and that three is only exemplary. In the present application, three sections were found to be preferred.

Figure 2:
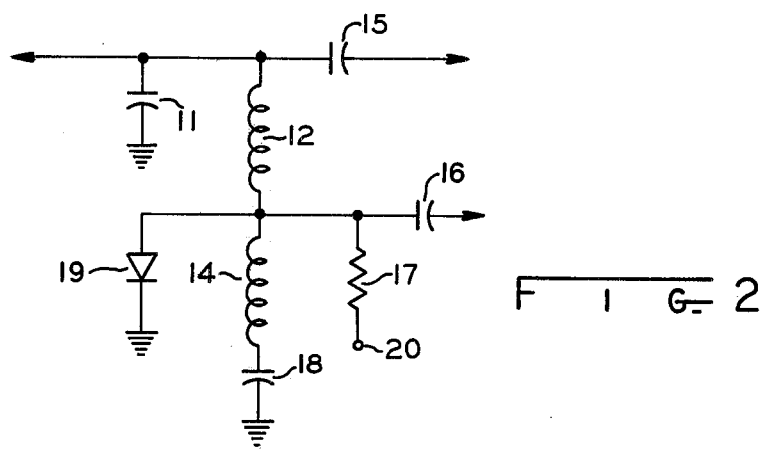
FIG. 2 is a schematic drawing of means for selecting the center frequency of a filter passband in response to an electrical signal.

The mechanical switches shown in FIG. 1 may be replaced by a switching diode and associated bias circuitry for effecting the shunting of inductors 14 by means of an electrical signal. Referring now to FIG. 2, there is shown such a diode switch connected to a filter section of the apparatus shown in FIG. 1. A diode 19 is placed at the junction of inductors 12 and 14. A resistor 17 is connected from the terminal 20 to the diode 19-inductor 14 junction. A capacitor 18 is placed in series with inductor 14 and a ground connection so as to provide a d.c. voltage block. The diode 19 has its remaining end grounded. When a positive potential is supplied to terminal 20, diode 19 becomes forward biased and inductor 14 is essentially shunted as was the case with the mechanical switch closure of FIG. 1. Capacitor 18 is selected so that it is an effective short circuit at the radio frequency being applied to the filter. The capacitor therefore appears as a short circuit to RF energy supplied by inductor 14 and as an open circuit to the d.c. bias current.

Figure 3:
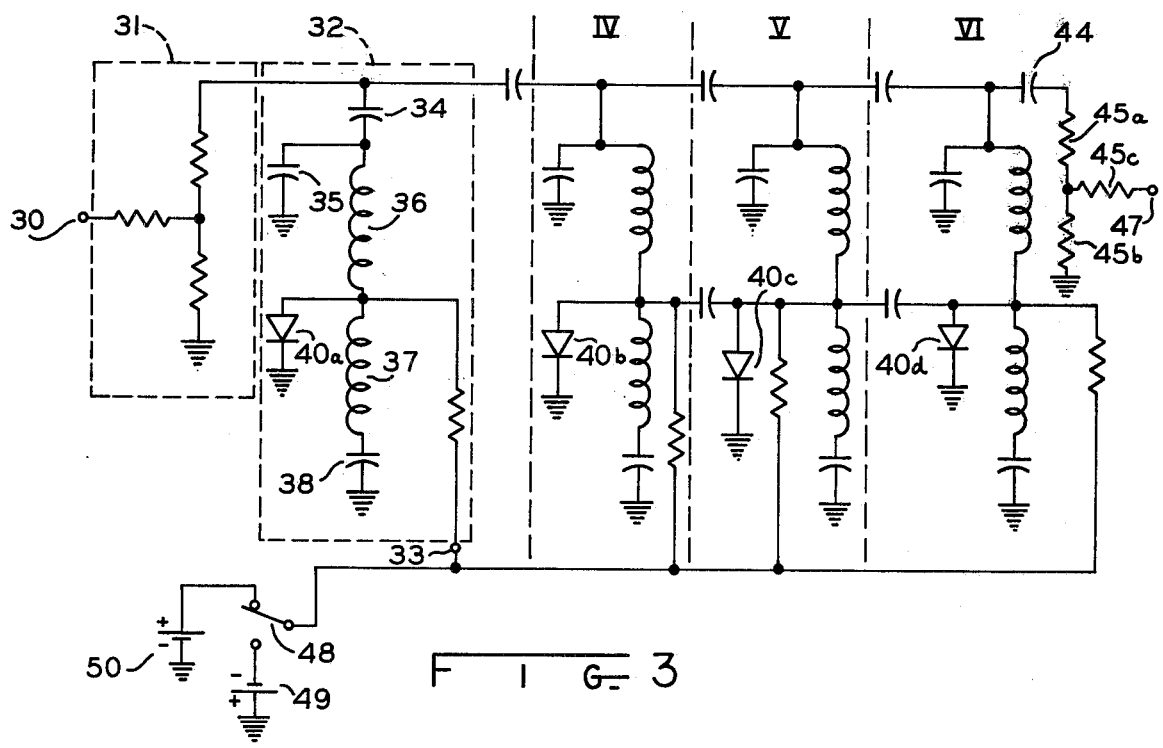
FIG. 3 is a schematic drawing of still another embodiment of the invention having a trap circuit for attenuating the lower sideband on a television radio frequency signal.

The electronic switch means shown in FIG. 2 for shunting inductor 14 is also shown in FIG. 3. The circuit of FIG. 3 comprises a three section bandpass filter having a selectable frequency response as in FIG. 1. Additionally, there is a trap filter at the input 32 which is a notch filter for reducing the lower sideband found with the television RF signal carrier. The three section filter is coupled by capacitor 12 to the lower sideband trap 32. The trap comprises a first capacitor 34 for supplying the RF signal to a first inductor 36 and a first capacitor 35. The capacitor 34 serially resonates with inductors 36 and 37. When a voltage is applied to terminal 33, the trap frequency is changed corresponding to a change in the lower sideband being transmitted. By judiciously selecting the components in the trap, it is possible to provide such filtering to the lower sideband in both channels 3 and 4.

The signal is supplied to the trap circuit 32 by an impedance matching network 31. The impedance matching network 31 comprises a combination of resistors which effectively isolate the tuned circuits comprising the filter from a television signal source connected to terminal 30 and ground.

The filter of FIG. 3 has a signal coupled by capacitor 44 to a second impedance matching network comprising resistors 45a, 45b and 45c. These resistors effectively prevent a circuit which receives the filtered signal from "loading" the filter structure thereby altering its frequency response. A switch 48 alternately connects the switching diodes in the filter from the conducting state to the non-conducting state depending upon its mechanical position. When a channel 3 signal is to be filtered, the switch is placed in a condition for connecting the diodes to a negative supply of potential 49. When a channel 4 signal is to be filtered, the switch is operated so as to forward bias the switching diodes 40 in both the filter sections I, II and III and the trap circuit 32. Voltage source 50 provides the forward bias voltage when a channel 4 signal is received.

Thus there has been described in a preferred embodiment means for providing a bandpass filter having a selectable frequency response. The center frequency of each filter may be selected by applying the proper polarity electrical signal to the filter structure. Bandwidth and phase linearity may be independently controlled for the two selected frequency responses.

What is claimed is:

1. A radio frequency bandpass filter comprising:
an input terminal and ground terminal for receiving signal to be filtered;
an output terminal for delivering a filtered signal;
first, second and third filter sections, each of said filter sections having a capacitor and inductor, each of said capacitors and inductors having a common connection forming a junction, said capacitors remaining ends being connected to said ground terminal; a first plurality of capacitors forming a series circuit with said junctions and said input and output terminals;
third, fourth and fifth inductors serially connecting each of the inductors in said filter sections with said ground terminal; and
a second plurality of capacitors for interconnecting the common ends of said inductors.

2. The apparatus of claim 1 further comprising means for shunting said third, fourth and fifth inductors in response to an electrical signal whereby the frequency response of said filter is altered.

3. A bandpass filter having a passband which may be shifted in frequency comprising:
an input terminal, output terminal and a common terminal;
a plurality of filter sections, each of said filter sections comprising first and second inductors connected in series, common ends of said inductors forming a first junction, one end of said series combination being connected to said common terminal;
a capacitor having a first end forming a second junction with the remaining end of said series combination of inductors, said capacitor having a second end connected to said common terminal;
a first plurality of coupling capacitors for interconnecting said first junctions of said filter sections whereby said first junctions form a series circuit having a first and second end part;
a second plurality of coupling capacitors for interconnecting the second junctions of each filter section;
means for coupling a signal from said input terminal to the first end of said series circuit;
means for coupling said series circuit second end to said output terminal; and
means for shunting said inductors in each of said filter sections which is connected to said common terminal whereby the passband of said filter is changed in frequency.

4. The apparatus of claim 3 further comprising a radio frequency notch filter serially connected to said input terminal.

5. The apparatus of claim 3 whereby said means for shunting said inductors is responsive to an electrical signal.

* * * * *